(12) United States Patent
Hsu et al.

(10) Patent No.: US 9,668,064 B2
(45) Date of Patent: May 30, 2017

(54) MICROELECTROMECHANICAL SYSTEM MICROPHONE

(71) Applicant: UNITED MICROELECTRONICS CORP., Hsin-Chu (TW)

(72) Inventors: Chang-Sheng Hsu, Hsinchu (TW); Yuan-Sheng Lin, Taoyuan (TW); Wei-Hua Fang, Kaohsiung (TW); Kuan-Yu Wang, New Taipei (TW); Yan-Da Chen, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/630,620

(22) Filed: Feb. 24, 2015

(65) Prior Publication Data
US 2016/0212551 A1    Jul. 21, 2016

(30) Foreign Application Priority Data
Jan. 15, 2015    (CN) .......................... 2015 1 0019327

(51) Int. Cl.
*B81C 1/00*     (2006.01)
*H04R 23/00*    (2006.01)
(52) U.S. Cl.
CPC ......... *H04R 23/00* (2013.01); *B81C 1/00182* (2013.01); *B81B 2201/0257* (2013.01); *B81B 2203/0127* (2013.01); *H04R 2201/003* (2013.01)

(58) Field of Classification Search
None
See application file for complete search history.

(56) References Cited

U.S. PATENT DOCUMENTS

| 7,203,393 B2 | 4/2007 | Rajan et al. | |
| 8,692,340 B1 | 4/2014 | Ata et al. | |
| 2013/0108084 A1* | 5/2013 | Zhang | H04R 1/222 381/174 |
| 2013/0160547 A1* | 6/2013 | Lee | G01P 15/125 73/514.28 |
| 2014/0220723 A1* | 8/2014 | Liu | H04R 19/005 438/53 |

* cited by examiner

*Primary Examiner* — Ali Naraghi
(74) *Attorney, Agent, or Firm* — Winston Hsu; Scott Margo

(57) ABSTRACT

A microelectromechanical system microphone includes a semiconductor-on-insulator structure, a plurality of resistors, a plurality of first openings, and a vent hole. The semiconductor-on-insulator structure includes a substrate, an insulating layer and a semiconductor layer. The resistors are formed in the semiconductor layer, the first openings are formed in the semiconductor layer, and the vent hole is formed in the insulating layer and the substrate. The resistors are connected to each other to form a resistor pattern, and the first openings are all formed within the resistor pattern.

15 Claims, 8 Drawing Sheets

MICROELECTROMECHANICAL SYSTEM MICROPHONE

BACKGROUND OF THE INVENTION

1. Field of the Invention

This invention relates to a microelectromechanical system (hereinafter abbreviated as MEMS) microphone, and more particularly, to a resistant-type MEMS microphone.

2. Description of the Prior Art

A MEMS device is a microscopic device that is fabricated using the same methods (e.g., the deposition of material layers and the selective removal of material layers) that are used to fabricate conventional analog and digital CMOS circuits. And the microscopic devices include both the electronic and mechanical function which is operated based on, for instance, electromagnetic, electrostrictive, thermoelectric, piezoelectric, or piezoresistive effects. Therefore, MEMS structures are often applied to microelectronics such as accelerometer, gyroscope, mirror, and acoustic sensor, etc.

MEMS acoustic sensors (also referred to as MEMS microphones) are apparatus for converting a voice to an electric signal. The MEMS microphones include piezoelectric-type MEMS microphone, piezoresistive-type MEMS microphone, and capacitive-type MEMS microphone. In the conventional piezoelectric-type MEMS microphone, piezoelectric material is used to form a diaphragm. In operation, changes in air pressure (e.g., sound waves) cause the diaphragm to vibrate which, in turn, causes charges proportional to the vibration. And thus, sound waves are converted into electrical signals. In the conventional piezoresistive-type MEMS microphone, piezoresistive material is used to form the diaphragm. In operation, sound waves cause the diaphragm to vibrate which, in turn, causes resistance changes proportional to the vibration. And thus, sound waves are converted into electrical signals. The capacitive-type MEMS microphone uses a principle of a capacitor where two electrodes face each other, where one electrode is fixed onto a substrate and the other electrode is suspended in the air such that a vibrating plate reacts to an external acoustic pressure so as to be moved. When distance between the two electrodes changes due to the sound waves, the capacitance changes and thus sound waves are converted into electrical signals.

However, the piezoelectric-type and piezoresistive-type MEMS microphones respectively require specific piezoelectric and piezoresistive materials for forming the diaphragm. Furthermore, the piezoelectric-type and piezoresistive-type MEMS microphones suffer low sensitivity and high noise. On the other hand, the distance between the two electrodes of the capacitive-type MEMS microphone must be made to an exact specification. And the fixed and flexible electrodes must experience low stress so that they would not bend and alter the inter-electrode distance between them. It is found that the capacitive-type MEMS microphone may fail when the two electrode bend or contact each other. Accordingly, the exact specification of the electrodes and the distance between the two electrodes contributes to the design complexity and affects the manufacturing yield of the capacitive-type MEMS microphone. And thus the capacitive-type MEMS microphone suffers high process cost and high process complexity.

Therefore, a different type of MEMS microphone is still in need.

SUMMARY OF THE INVENTION

According to the claimed invention, a MEMS microphone is provided. The MEMS microphone includes a semiconductor-on-insulator structure, a plurality of resistors, a plurality of first openings, and a vent hole. The semiconductor-on-insulator structure includes a substrate, an insulating layer and a semiconductor layer. The resistors are formed in the semiconductor layer, the first openings are formed in the semiconductor layer, and the vent hole is formed in the insulating layer and the substrate. The resistors are connected to each other to form a resistor pattern, and the first openings are all formed within the resistor pattern.

According to the claimed invention, a MEMS microphone layout structure is provided. The MEMS microphone layout structure includes a resistor pattern formed in a first layer, a vent hole formed in a second layer, and a first opening pattern formed in the first layer. The first opening pattern and at least a portion of the resistor pattern are overlapped with the vent hole.

According to the MEMS microphone and the MEMS microphone layout structure provided by the present invention, the first opening pattern, which is formed by the first openings, is to define diaphragm(s), and the diaphragm(s) is connected to the resistors. When the diaphragm vibrates due to the sound wave, resistor deformation is caused. Consequently, resistance of the resistor connected to the diaphragm is changed. By detecting the resistance change, the sound waves are converted into electrical signals. More important, the MEMS microphone provided by the present invention can be fabricated by the semiconductor process in the-state-of-the-art, and materials conventionally involved in the semiconductor process can be used to form the provided MEMS microphone, and thus piezoelectric or piezoresistive materials are no longer in need. Accordingly, a MEMS microphone with superior sensitivity is provided while the product complexity is lowered and the cost is reduced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for manufacturing a MEMS microphone and a MEMS microphone layout structure provided by a first preferred embodiment of the present invention, wherein FIGS. 2 and 3 are schematic drawings in a step subsequent to FIG. 1, and FIG. 3 is a cross-sectional view taken along a Line A-A' of FIG. 2.

FIGS. 4 and 5 respectively are schematic drawings in a step subsequent to FIGS. 2 and 3, and FIG. 5 is a cross-sectional view taken along a Line A-A' of FIG. 4.

FIGS. 6 and 7 respectively are schematic drawings in a step subsequent to FIGS. 4 and 5, and FIG. 7 is a cross-sectional view taken along a Line A-A' of FIG. 6.

FIGS. 10-12 are schematic drawing illustrating a MEMS microphone and a MEMS microphone layout structure provided by a second preferred embodiment of the present invention, wherein FIG. 11 is cross-sectional view taken along a Line B-B' of FIG. 10.

FIG. 12 is a schematic drawing illustrating the MEMS microphone of the preferred embodiment in operation.

DETAILED DESCRIPTION

Figure 1:
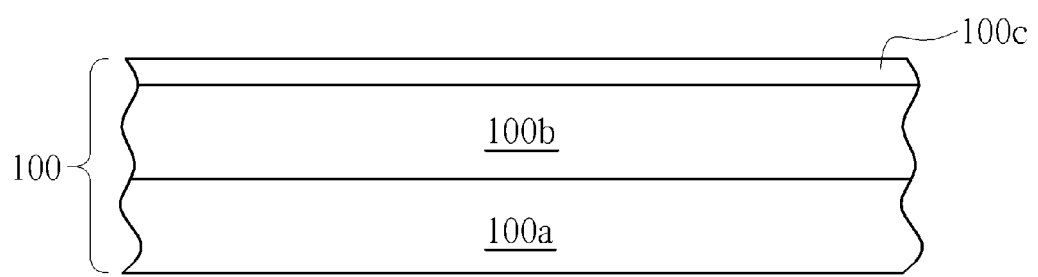
Figure 2:
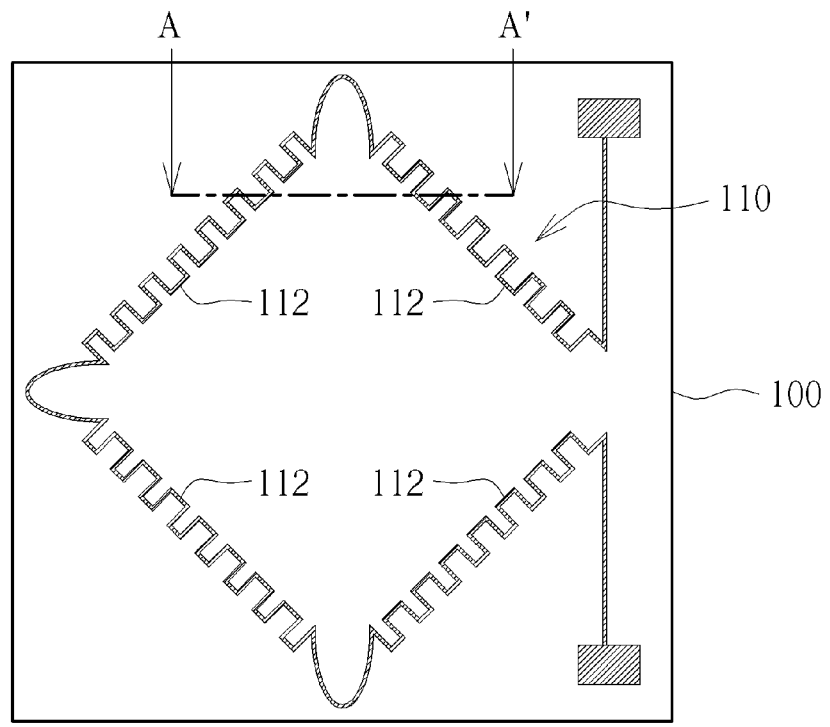
Figure 3:
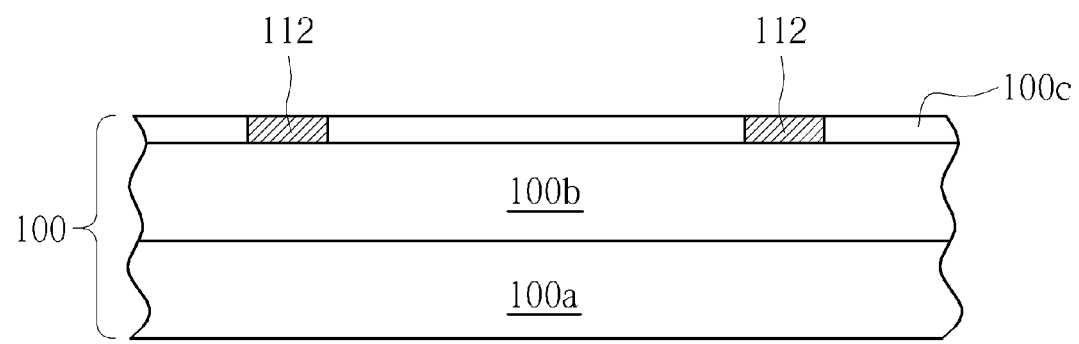
Figure 4:
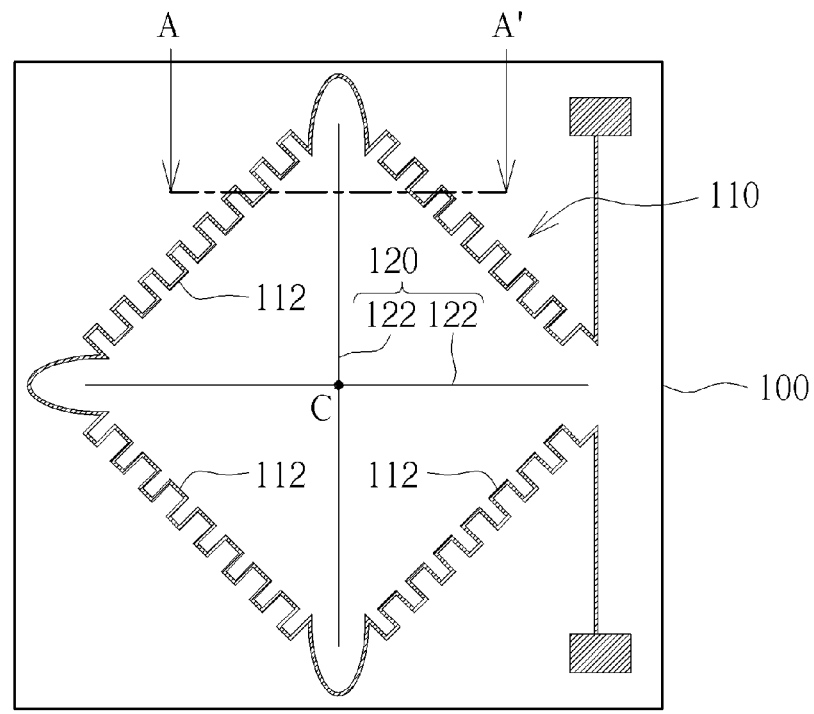
Figure 5:
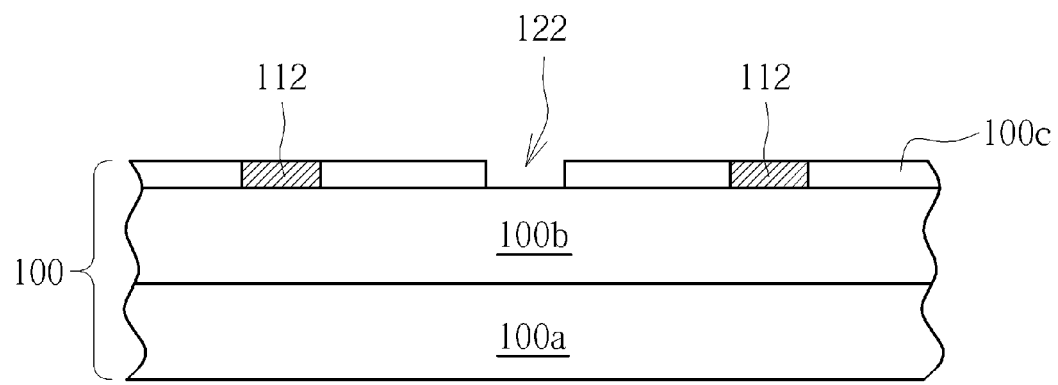
Figure 6:
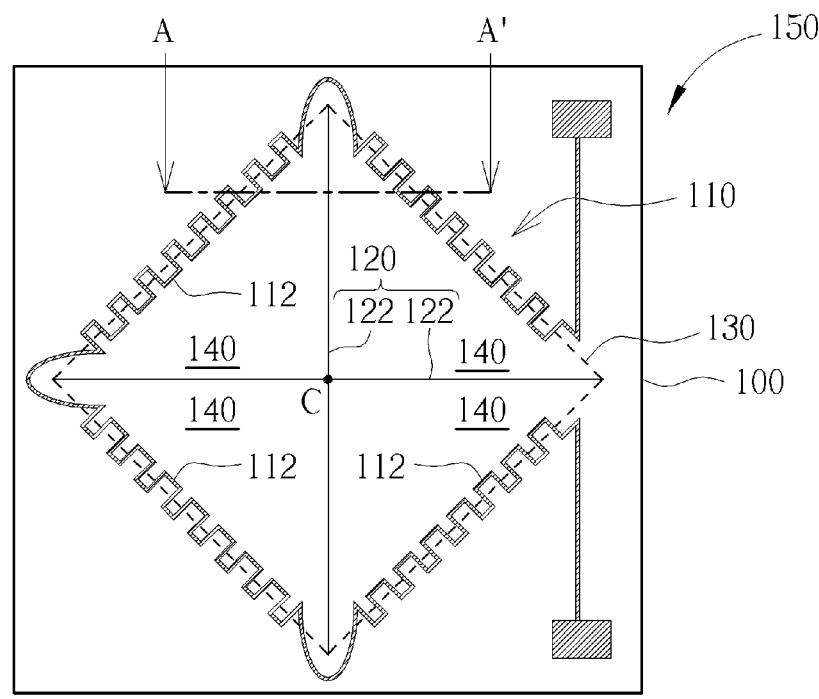
Figure 7:
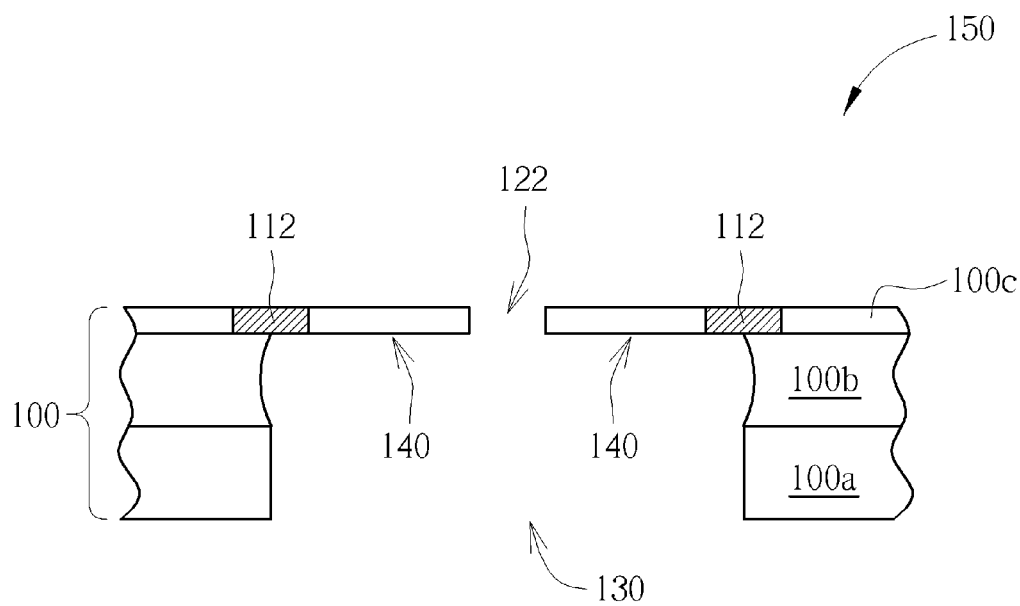

Please refer to FIGS. 1-7, which are schematic drawings illustrating a method for manufacturing a MEMS microphone and a MEMS microphone layout structure provided by a first preferred embodiment of the present invention. It should be noted that FIG. 3 is a cross-sectional view taken a Line A-A' of FIG. 2, FIG. 5 is a cross-sectional view taken a Line A-A' of FIG. 4, and FIG. 7 is a cross-sectional view taken a Line A-A' of FIG. 6. As shown in FIG. 1, the preferred embodiment provides a semiconductor-on-insulator structure 100, and the semiconductor-on-insulator structure 100 includes a substrate 100a, an insulating layer 100b formed on the substrate 100a, and a semiconductor layer 100c formed on the insulating layer 100b. According to the preferred embodiment, the semiconductor layer 100c is a single-crystalline silicon layer. Accordingly, the single-crystalline silicon layer 100c, the insulating layer 100b and the substrate 100a construct a silicon-on-insulator (SOI) wafer. However, according to a modification to the preferred embodiment, the semiconductor layer 100c can include a polysilicon layer, an epitaxial silicon layer, or an amorphous silicon layer.

Please refer to FIGS. 2 and 3. Next, a mask layer (not shown) is formed on the semiconductor-on-insulator structure 100 and followed by performing a first lithography process (not shown). Thus the mask layer is patterned and the patterned mask layer serves as an implant mask in an ion implantation. The ion implantation is performed to form a plurality of doped regions in the semiconductor layer 100c, and the doped regions serve as resistors 112. More important, the resistors 112 are physically and electrically connected to each other to a form a resistor pattern 110 as shown in FIG. 2. The resistor pattern 110 includes a convex polygon, but not limited to this. The resistor pattern 110 can include a parallelogram such as a square shown in FIG. 2, the resistor pattern 110 also can include a parallelogram such as a rectangle shown in FIG. 9, the resistor pattern 110 can further includes a circular pattern as shown in FIG. 10. Those skilled in the art would easily realize that the resistors 112 can be arranged to form kinds of geometrical pattern depending on different requirements. Additionally, each of the resistors 112 (that is each side of the resistor pattern 110) can include a zigzag pattern or undulated pattern, but not limited to this.

It is noteworthy that according to a modification to the preferred embodiment, when the semiconductor layer 110c includes the polysilicon layer, the epitaxial silicon layer, or the amorphous silicon layer, the resistors 112 can be formed by other process instead of the ion implantation. For example, a metal layer can be formed on the semiconductor layer 100c and followed by patterning the metal layer. Thus metal wires are formed and serve as the resistors 112, and the resistor pattern 110 formed by the resistors 112 made of metal wires is obtained. Or, the semiconductor layer 100c can be patterned, and a metal layer is formed in the patterned semiconductor layer 100c. Thus metal wires are formed and serve as the resistors 112, and the resistor pattern 110 formed by the resistors 112 made of metal wires is obtained. In still another modification to the present invention, any materials suitable to form the resistors 112 and the resistor pattern 110 can be used since the resistors 112 and the resistor pattern 110 are electrically isolated from the substrate 100a by the insulating layer 100b.

Please refer to FIGS. 4 and 5. Next, another mask layer (not shown) is formed on the semiconductor-on-insulator structure 100, and a second lithography process (not shown) is performed to pattern the mask layer. The patterned mask layer serves as an etching mask in an etching process, and the etching process is performed to form a plurality of first openings 122 in the semiconductor layer 100c. More important, the first openings 122 are all formed within the resistor pattern 110 and arranged to form a first opening pattern 120 as shown in FIG. 4. In the preferred embodiment, the first opening pattern 120 is arranged to form a cross crossing a center C of the resistor pattern 110 as shown in FIG. 4. That is, the first openings 122 are arranged to cross the center C of the resistor pattern 110. However, those skilled in the art would easily realize that the first openings 122 can be arranged to form different kinds of pattern, therefore the first opening pattern 120 is not limited to this. For example, when the resistor pattern 110 is a convex polygon, the first opening pattern 120 can include a radical pattern corresponding to each interior angle of the convex polygon.

Please refer to FIGS. 6 and 7. After forming the first openings 122 and the first opening pattern 120, another mask layer (not shown) is formed on a back side of the semiconductor-on-insulator structure 100, that is, the mask layer is formed on a back side of the substrate 100a. A third lithography process is subsequently performed to pattern the mask layer. The patterned mask layer serves as an etching mask in an etching process, and the etching process is performed to form an opening (not shown) in the substrate 100a. Next, the insulating layer 100b is etched through the opening. Consequently, a vent hole 130 is formed in the insulating layer 100b and the substrate 100a. It should be noted that in FIG. 6, edges of the vent hole 130 is depicted by dotted line. As shown in FIGS. 6 and 7, the vent hole 130 is overlapped with at least a portion of the resistor pattern 110. Furthermore, the vent hole 130 is overlapped with the first opening pattern 120. In other words, the first openings 122 and at least a portion of each resistor 112 are suspended over the vent hole 130. Accordingly, a MEMS microphone 150 and its layout structure provided by the preferred embodiment are obtained. Simply speaking, the first openings 122/the first opening pattern 120 and the resistors 112/the resistor pattern 110 are formed in a same layer while the vent hole 130 is formed in another layer according to the preferred embodiment.

Please still refer to FIGS. 6 and 7. More important, a plurality of diaphragms 140 are defined by the first openings 122/the first opening pattern 120. As shown in FIG. 7, the diaphragms 140 and at least a portion of each resistor 112 are formed above the vent hole 130. Furthermore, one diaphragm 140 defined by the first openings 122 and a portion of the resistor pattern 110 (that is the resistor 112 connected to the neighboring diaphragm 140) form a convex polygon, such as a triangle shown in FIG. 6. And the resistor 112 and the first openings 122 respectively are sides of the triangle.

Figure 8:
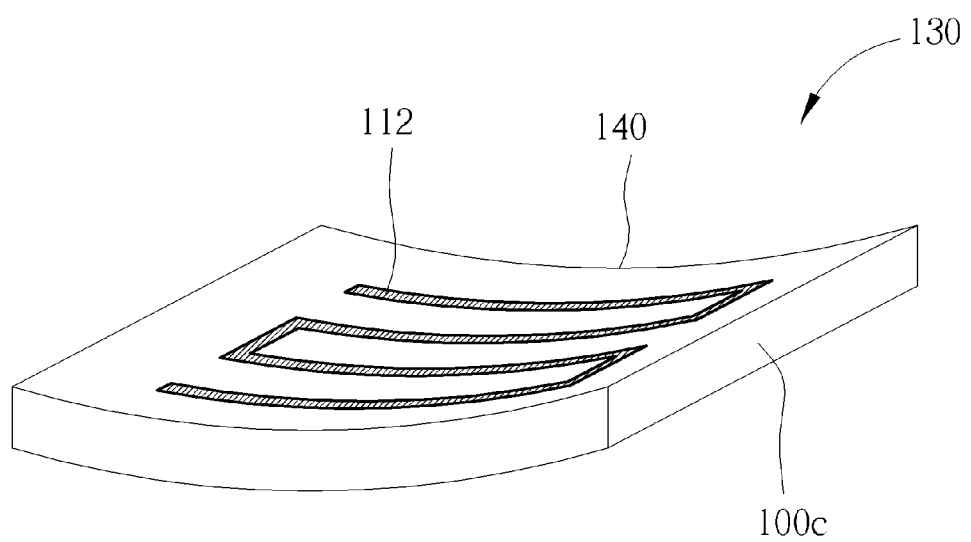
FIG. 8 is an enlarged view of a portion of the MEMS microphone provided by the present invention in operation.

Please refer to FIG. 8, which is an enlarged view of a portion of the MEMS microphone 150 provided by the present invention in operation. As shown in FIG. 8, the diaphragm 140 defined by the first opening pattern 120/the first openings 122 includes at least a portion of the resistor 112 formed therein. The diaphragm 140 and the portion of the resistor 112 formed therein are suspended over the vent hole 130. When acoustic pressure arrives the diaphragm 140, the diaphragm 140 is to vibrate and thus resistor deformation is caused as shown in FIG. 8. It is found that the resistor deformation reaches the maximum at the edge of the diaphragm 140. The resistor deformation induces resistance change correspondingly, and this resistance change can be measured using a Wheatstone bridge and thus transformed to a related strain quantity. Consequently, the sound waves are converted into electrical signals by the MEMS microphone 150 provided by the present invention.

Figure 9:
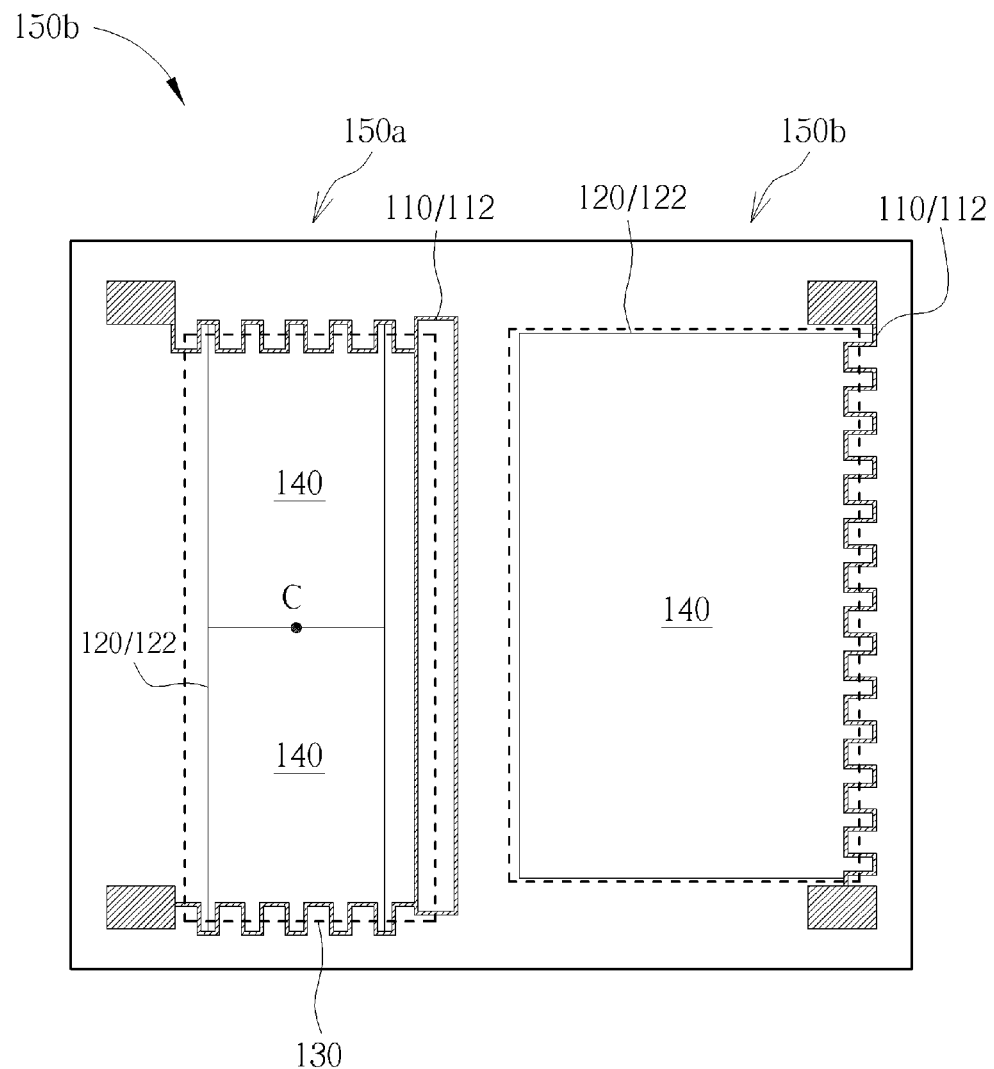
FIG. 9 is a schematic drawing illustrating a modification to the first preferred embodiment.
Figure 10:
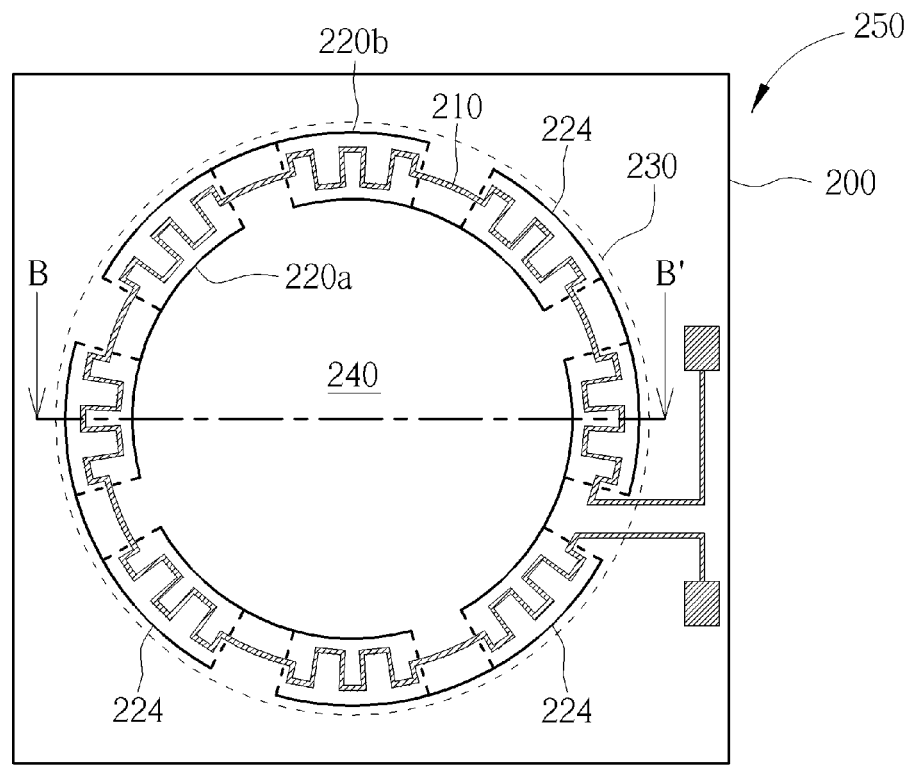

Please refer to FIG. 9, which is a schematic drawing illustrating a modification to the first preferred embodiment. It should be noted that the MEMS microphone and its layout structure provided by the modification can be manufactured by the method mentioned above, therefore those details are omitted in the interest of brevity. Additionally, elements the same in the first preferred embodiment and the modification are designated by the same numerals. As shown in FIG. 9, according to the modification, a plurality of MEMS microphone 150a, 150b of different layout structure are formed in the same semiconductor-on-insulator structure 100. As shown in the left of FIG. 9, the layout structure of the MEMS microphone 150a includes a resistor pattern 110 and a first opening pattern 120. The first opening pattern 120 crosses a center C of the resistor pattern 110. The MEMS microphone 150a further includes a vent hole 130 (shown in the dotted line), and the first opening pattern 120 and at least a portion of the resistor pattern 110 are overlapped with the vent hole 130. A plurality of diaphragms 140 are defined by the first opening pattern 120, and the diaphragms 140 are formed above the vent hole 130 as shown in FIG. 9. Furthermore, one diaphragm 140 defined by the first opening pattern 120 and a portion of the resistor pattern 110 (that is the resistor 112 connected to the neighboring diaphragm 140) form a convex polygon, such as a rectangle shown in the left of FIG. 9. And the resistor 112 and the first openings 120 respectively are sides of the rectangle.

Please refer to right of FIG. 9. The layout structure of the MEMS microphone 150b shown in the right of FIG. 9 includes a resistor pattern 110, a first opening pattern 120, and a vent hole 130 (shown in the dotted line). The first opening pattern 120 and at least a portion of the resistor pattern 110 are overlapped with the vent hole 130. A plurality of diaphragms 140 are defined by the first opening pattern 120, and the diaphragms 140 are formed above the vent hole 130 as shown in the right of FIG. 9. It is noteworthy that, as shown in the layout structure of the MEMS microphone 150b, though the first opening pattern 120 does not cross a center of the resistor pattern 110, one diaphragm 140 defined by the first openings 122, and a portion of the resistor pattern 110 (that is the resistor 112 connected to the neighboring diaphragm 140) still form a convex polygon, such as a rectangle shown in the right of FIG. 9. And the resistor 112 and the first openings 120 respectively are sides of the rectangle.

As shown in FIG. 9, according to the MEMS microphone 150a and 150b provided by the present invention, the diaphragms 140 defined by the first opening pattern 120/the first openings 122 includes at least a portion of the resistor 112 formed therein. The diaphragm 140 and the portion of the resistor 112 formed therein are suspended over the vent hole 130. When acoustic pressure arrives the diaphragm 140, the diaphragm 140 is to vibrate and thus resistor deformation is caused as shown in FIG. 8. The resistor deformation induces resistance change correspondingly, and this resistance change can be measured using a Wheatstone bridge and transformed to a related strain quantity. Consequently, the sound waves are converted into electrical signals by the MEMS microphone 150a/150b provided by the present invention. More important, since the MEMS microphone 150a/150b of different sizes or different layout structures are formed on the same semiconductor-on-insulator structure 100, a plurality of diaphragms 140 of different sizes are provided. And those diaphragms 140 of different sizes are provided to detect wave sounds of different frequencies. Accordingly, sensitivity and accuracy of the acoustic sensor are improved according to the modification.

Figure 11:
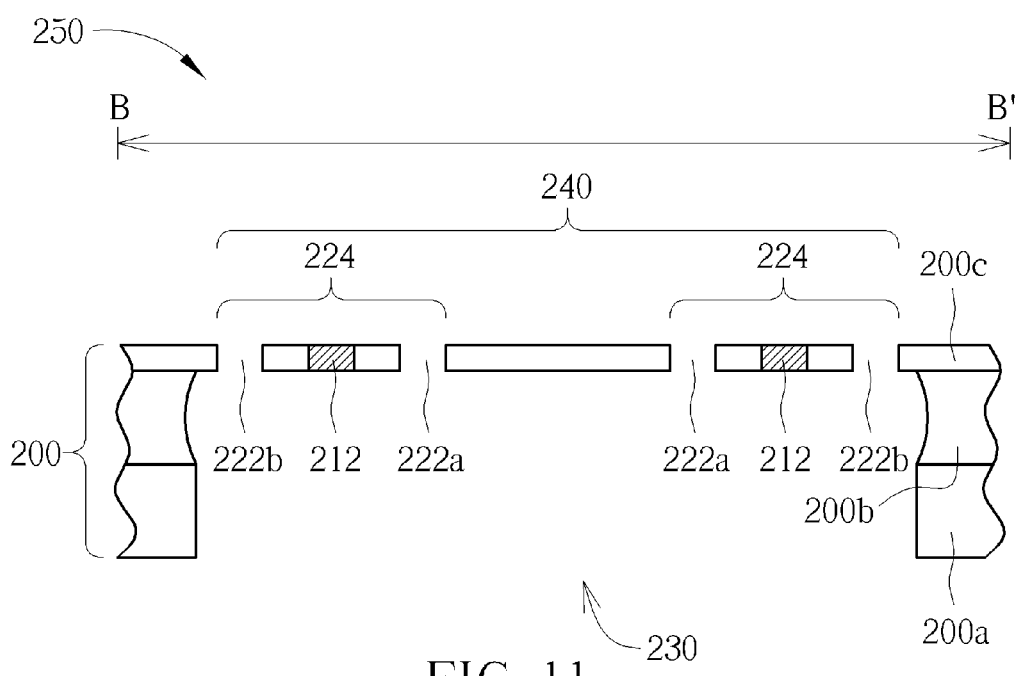
Figure 12:
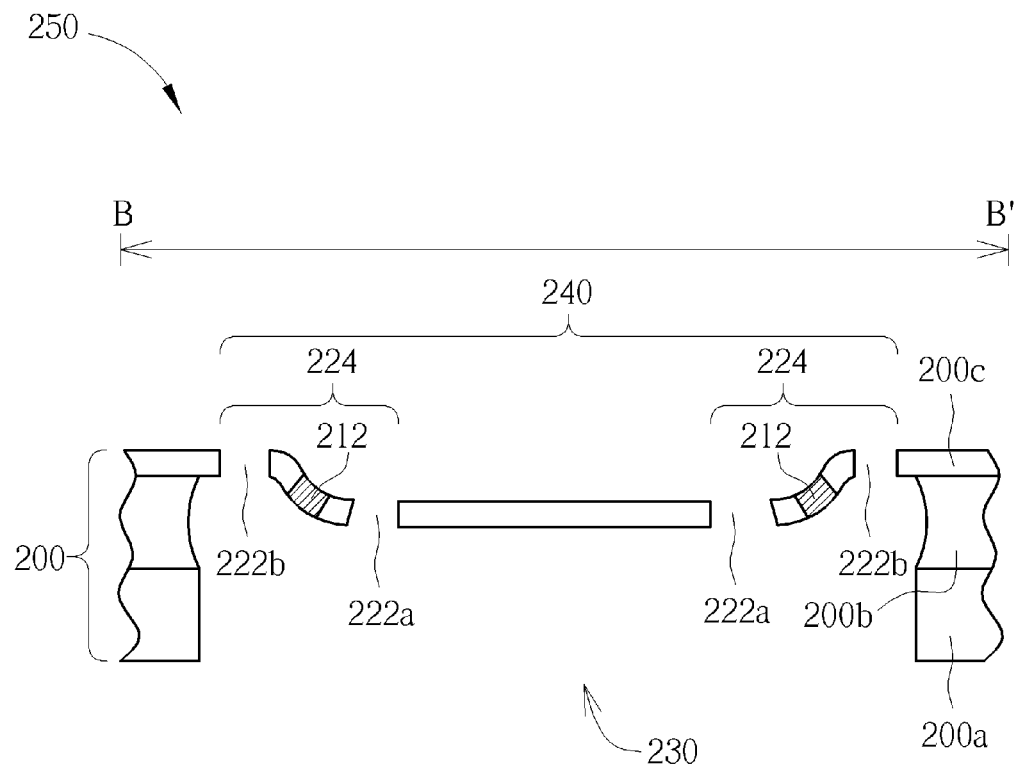

Please refer to FIGS. 10-12, which are schematic drawing illustrating a MEMS microphone and a MEMS microphone layout structure provided by a second preferred embodiment of the present invention. It should be noted that since the MEMS microphone and the MEMS microphone layout structure of the second preferred embodiment can be manufactured by the method mentioned afore, those details are omitted in the interest of brevity.

As shown in FIG. 10 and FIG. 11, which is cross-sectional view taken along a Line B-B' of FIG. 10, a MEMS microphone 250 is provided. The MEMS microphone 250 include a semiconductor-on-insulator structure 200, and the semiconductor-on-insulator structure 200 includes a substrate 200a, an insulating layer 200b formed on the substrate 200a, and a semiconductor layer 200c formed on the insulating layer 200b. As mentioned above, the semiconductor layer 200c can include a single-crystalline silicon layer, a polysilicon layer, an epitaxial silicon layer, or an amorphous silicon layer. The MEMS microphone 250 and its layout structure further include a plurality of resistors 212. The resistors 212 can be formed by conventional semiconductor processes. Accordingly, the resistors 212 can be doped regions formed in the semiconductor layer 200c or the metal wires formed on the semiconductor layer 200c. As shown in FIG. 10, the resistors 212 are physically and electrically connected to form a resistor pattern 210, and the resistor pattern 210 include a circular pattern according to the preferred embodiment.

Please refer to FIGS. 10 and 11 again. The MEMS microphone 250 and its layout structure further includes a plurality of first openings 222a and a plurality of second openings 222b formed in the semiconductor layer 200c. As shown in FIG. 10, the first openings 222a are arranged to form a first opening pattern 220a and the first openings 222a/the first opening pattern 220a is formed within the resistor pattern 210. The second openings 222b are arranged to form a second opening pattern 220b, and the second openings 222b/the second opening pattern 220b is formed beyond the resistor pattern 210. The first opening pattern 220a and the second opening pattern 220b are arranged to form a concentric pattern. More important, the first opening pattern 220a and the second opening pattern 220b define a diaphragm 240. Additionally, in the preferred embodiment, overlapping regions 224 are defined between the first openings 222a/the first opening pattern 220a and the second openings 222b/the second opening pattern 220b from a plan view, and the resistors 212 are respectively formed within the overlapping regions 224 between the first opening pattern 220a and the second opening pattern 220b. In other words, there are always one first opening 222a and one second opening 222b disposed at two opposite sides of each resistor 212.

Please still refer to FIGS. 10 and 11. The MEMS microphone 250 and its layout structure further include a vent hole 230 (shown by the dotted line in FIG. 10) formed in the insulating layer 200b and the substrate 200a. As shown in FIG. 10, the vent hole 230 is overlapped with the second opening pattern 220b, the resistor pattern 210 and the first opening pattern 220a according to the preferred embodiment. In other words, the first openings 222a, the resistors 212, and the second openings 222b are all formed above the vent hole 230.

Please refer to FIG. 12, which is a schematic drawing illustrating the MEMS microphone 250 of the preferred embodiment in operation. As shown in FIG. 12, according to the MEMS microphone 250 provided by the present invention, the diaphragm 240 defined by the first opening pattern 220a and the second opening pattern 220b includes the resistors 212 formed therein, and the diaphragm 240 and the resistors 212 are suspended over the vent hole 230. When acoustic pressure arrives the diaphragm 240, the diaphragm 240 is to vibrate and thus resistor deformation is caused as shown in FIG. 12. The resistor deformation induces resistance change correspondingly, and this resistance change can be measured using a Wheatstone bridge and transformed to a related strain quantity. Consequently, the sound waves are converted into electrical signals by the MEMS microphone 250 provided by the present invention.

According to the MEMS microphone and the MEMS microphone layout structure provided by the present invention, the first opening pattern, which is formed by the first openings, is to define diaphragm(s), and the diaphragm(s) is connected to the resistors. When the diaphragm vibrates due to the sound wave, resistor deformation is caused. Consequently, resistance of the resistor connected to the diaphragm is changed. By detecting the resistance change, the sound waves are converted into electrical signals. More important, the MEMS microphone provided by the present invention can be fabricated by the semiconductor process in the-state-of-the-art, and materials conventionally involved in the semiconductor process can be used to form the provided MEMS microphone, and thus piezoelectric or piezoresistive materials are no longer in need. Accordingly, a MEMS microphone with superior sensitivity is provided while the product complexity is lowered and the cost is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A microelectromechanical system (MEMS) microphone, comprising:
    a semiconductor-on-insulator structure comprising a substrate, an insulating layer, and a semiconductor layer;
    a plurality of resistors formed in the semiconductor layer, the resistors being connected to each other to form a resistor pattern, and the resistors respectively comprising a metal wire;
    a plurality of first openings formed in the semiconductor layer, the first openings all being formed within the resistor pattern;
    a vent hole formed in the insulating layer and the substrate; and
    a diaphragm suspended over the vent hole, the diaphragm comprising at least a portion of each resistor formed therein.

2. The MEMS microphone according to claim 1, wherein the semiconductor layer comprises a polysilicon layer, an epitaxial silicon layer, or an amorphous silicon layer.

3. The MEMS microphone according to claim 1, wherein the first openings are arranged to cross a center of the resistor pattern.

4. The MEMS microphone according to claim 3, further comprising a plurality of diaphragms are defined by the first openings, and the diaphragms and at least a portion of each resistor are formed above the vent hole.

5. The MEMS microphone according to claim 1, further comprising a plurality of second openings formed in the semiconductor layer.

6. The MEMS microphone according to claim 5, wherein the first openings and the second openings are respectively formed at two opposite sides of the resistors.

7. The MEMS microphone according to claim 6, further comprising a plurality of overlapping regions defined by the first openings and the second openings, and the resistors being respectively formed within the overlapping regions.

8. The MEMS microphone according to claim 5, wherein the first openings, the resistors, and the second openings are all formed above the vent hole.

9. A microelectromechanical system (MEMS) microphone layout structure, comprising:
    a resistor pattern formed in a first layer, the resistor pattern comprising metal wires;
    a vent hole formed in a second layer;
    a first opening pattern formed in the first layer, the first opening pattern and at least a portion of the resistor pattern being overlapped with the vent hole; and
    a diaphragm formed in the first layer, and the diaphragm being defined at least by the first opening pattern.

10. The MEMS microphone layout structure according to claim 9, wherein the first opening pattern defines at least a diaphragm in the first layer, and the diaphragm and a portion of the resistor pattern form a convex polygon.

11. The MEMS microphone layout structure according to claim 10, wherein the portion of the resistor pattern and the first opening pattern respectively are sides of the convex polygon.

12. The MEMS microphone layout structure according to claim 9, wherein the first opening pattern crosses a center of the resistor pattern.

13. The MEMS microphone layout structure according to claim 9, further comprising a second opening pattern formed in the first layer, and the first opening pattern and the second opening pattern form a concentric pattern.

14. The MEMS microphone layout structure according to claim 13, wherein the resistor pattern is formed in between the first opening pattern and the second opening pattern.

15. The MEMS microphone layout structure according to claim 14, wherein the second opening pattern, the resistor pattern, and the first opening pattern are all overlapped with the vent hole.

* * * * *